United States Patent [19]
York et al.

[11] Patent Number: 5,132,761
[45] Date of Patent: Jul. 21, 1992

[54] METHOD AND APPARATUS FOR FORMING AN INFRARED DETECTOR HAVING A REFRACTORY METAL

[75] Inventors: Rudy L. York, Plano; Joseph D. Luttmer, Richardson; Chang F. Wan; Thomas W. Orent, both of Garland; Larry D. Hutchins, Richardson; Art Simmons, Anna, all of Tex.

[73] Assignee: Texas Instruments Incorporated, Dallas, Tex.

[21] Appl. No.: 593,363

[22] Filed: Oct. 1, 1990

Related U.S. Application Data

[63] Continuation of Ser. No. 373,951, Jun. 29, 1989, abandoned.

[51] Int. Cl.⁵ .................. H01L 27/14; H01L 23/48
[52] U.S. Cl. .................. 357/30; 357/31; 357/32; 357/67; 357/71
[58] Field of Search ............ 357/30 R, 30 H, 30 L, 357/30 Q, 30 B, 71, 31, 32, 67 S, 30 G

[56] References Cited

U.S. PATENT DOCUMENTS

| | | | |
|---|---|---|---|
| 4,521,798 | 6/1985 | Baker | 357/31 |
| 4,654,686 | 3/1987 | Borrello | 357/23.1 |
| 4,659,427 | 4/1987 | Barry et al. | 357/71 |
| 4,684,812 | 8/1987 | Tew et al. | 357/32 |
| 4,720,738 | 1/1988 | Simmon | 357/30 Q |
| 4,753,709 | 6/1988 | Welch et al. | 357/43 |
| 4,824,521 | 4/1989 | Kulkarni et al. | 156/643 |

FOREIGN PATENT DOCUMENTS

| | | | |
|---|---|---|---|
| 61-214462 | 9/1986 | Japan | 357/30 |
| 62-261171 | 11/1987 | Japan | 357/30 |

OTHER PUBLICATIONS

Sze, "*Semiconductor Devices: Physics & Technology*", 1985, p. 484.

Murarka, "Refractory Silicides for Integrated Circuits", May 7, 1980, pp. 775–792.

*Primary Examiner*—Mark Prenty
*Attorney, Agent, or Firm*—René E. Grossman; Richard L. Donaldson

[57] ABSTRACT

Method of manufacturing an infrared detector having a refractory metal (16) within the metal-insulator-semiconductor structure (MIS) provides a process applicable for high volume production of infrared focal plane array detectors. The process of the present invention uses a refractory metal such as tantalum as the gate (16) which is less susceptible to the etching by the bromine solution used to etch the vias (22) as compared to aluminum. Additionally, the etching of the refractory metal film to form the MIS structure can be done with a fluorine-containing plasma, thus avoiding the corrosion of the metal associated with etching aluminum metal films in a chlorine-containing plasma.

21 Claims, 2 Drawing Sheets

1

METHOD AND APPARATUS FOR FORMING AN INFRARED DETECTOR HAVING A REFRACTORY METAL

This application is a continuation, of application Ser. No. 07/373,951, filed Jun. 29, 1989 and now abandoned.

TECHNICAL FIELD OF THE INVENTION

This invention relates in general to a method and apparatus for forming an infrared detector, and in particular, to a method and apparatus for forming an infrared detector utilizing refractory metals as the metallization layers

BACKGROUND OF THE INVENTION

When manufacturing infrared focal plane array detectors, one of the important considerations is the construction of the metal-insulator-semiconductor (MIS) structure. In the past, the standard process for fabricating mercury cadmium tellurium (HgCdTe) focal plane array MIS devices utilized aluminum as the gate metal. Many problems have been encountered when using aluminum as the gate metal for MIS structures. Specifically, the aluminum has suffered severe corrosion when exposed to the chemicals required in subsequent processes. Additionally, the plasma species used to dry etch the aluminum tends to create a corrosive environment, which damages the detector. As a result of these complexities, the uniformity across the entire substrate has suffered, resulting in poor device performance.

One of the primary concerns with aluminum is its significant etching by the bromine solution which is used to form vias or contacts in overlaying zinc sulfide insulator films. As a result, extreme care must be taken not to overetch the zinc sulfide insulator in the bromine solution when forming the vias or contacts to the aluminum substrate.

In order to prevent etching of the aluminum substrate in the bromine solution, additional processing steps must be introduced to form a protective oxide coating on the surface of the aluminum. The oxide coating is not readily etched in the bromine solution; however, additional processing steps must be introduced later to remove the oxide coating in order to make good electrical contact to the aluminum gate.

Another problem associated with the use of aluminum as the metal layer is that the chlorinecontaining plasma commonly used to dry etch aluminum films tends to corrode the aluminum films when the metal pattern is subsequently exposed to the ambient atmosphere. As in the first problem discussed above, additional processing steps must be taken to remove any chlorine-containing residue from the etched aluminum film prior to exposure to the atmosphere. These additional processes are burdensome in high volume production.

A need has therefore arisen for a method of forming a metal pattern in an infrared focal plane array detector which avoids corrosion of the metal pattern in the subsequent processes necessary for fabricating the infrared detector and which is compatible with the high volume production of infrared focal plane array detectors.

SUMMARY OF THE INVENTION

In accordance with the present invention, a method for forming an infrared detector utilizing a refractory metal as the metallization layer is provided which substantially eliminates or reduces the disadvantages and problems associated with the use of aluminum metal as the metallization layer.

One aspect of the invention comprises a method for forming an infrared detector utilizing a refractory metal in a metal-insulator-semiconductor (MIS) structure. In accordance with the invention, an infrared detector having an MIS structure requires that an infrared light sensing semiconductor layer be attached to a signal processor. The sensing semiconductor layer may be mercury cadmium telluride (HgCdTe) and the signal processor may be a silicon integrated circuit. The semiconductor layer is attached to the processor by an epoxy material. Next, a via is formed through the semiconductor layer (HgCdTe) and through the epoxy to an aluminum pad of the processor. An insulator layer is then deposited on the surface of the semiconductor. The insulator layer may be zinc sulfide (ZnS). Next, a refractory metal is deposited onto the insulator layer and metal gates are formed by etching the metal layer. The metal layer may be a refractory metal such as tantalum, molybdenum, tungsten, titanium or a refractory metal alloy such as titanium/tungsten. A second layer of the insulator, such as ZnS, is deposited to enclose the metal gate. Next, vias or contacts are formed through the second insulating layer to expose the surface of the refractory metal gate and through both the second and first insulating layer to expose the surface of the aluminum pad of the processor. Finally, a conductive metal interconnect layer is formed on the insulator over-layer and within the vias or contacts to electrically connect the metal gate to the processor.

The infrared detector of the present invention has the capacity to withstand the bromine solution necessary to form the vias. Additionally, it has been found that when utilizing tantalum or other suitable refractory metals, such as molybdenum or tungsten, the fluorine-plasma etching process does not cause severe corrosion as does the chlorine-plasma etching process necessary to etch aluminum.

The present invention presents technical advantages over the use of aluminum metal in infrared detector because of its ability to increase throughput, process simplifications, its ability to withstand bromine solution, and the elimination of the corrosive chlorine plasma used to etch the aluminum in the process environment.

BRIEF DESCRIPTION OF THE DRAWINGS

Other aspects of the invention and their advantages will be discerned after studying the detailed description in connection with the drawings in which.

DETAILED DESCRIPTION OF THE INVENTION

The present method comprises the fabrication of infrared detectors in mercury cadmium tellurium (HgCdTe) utilizing a refractory metal such as tantalum, molybdenum, titanium, tungsten or a combination thereof. Specifically, the refractory metal is utilized in the metal-insulator-semiconductor (MIS) structure to optimize the fabrication of the infrared detector.

Figure 1:
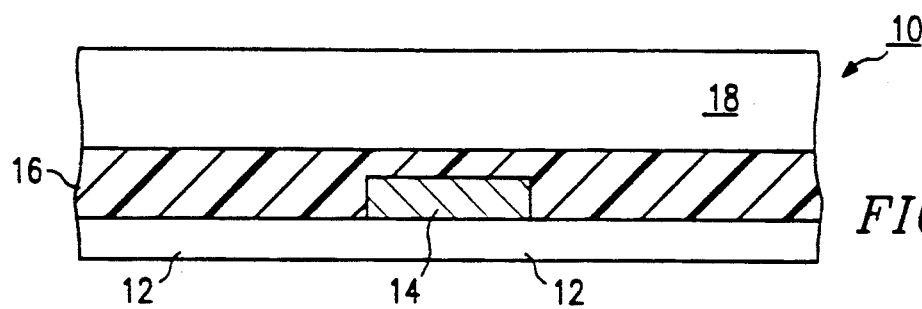
FIG. 1 is a cross-sectional view of an integrated circuit workpiece illustrating the initial epoxy attachment of the semiconductor material (HgCdTe) to the integrated circuit processor.

Referring to FIG. 1, an integrated workpiece is shown in its initial fabrication step in an enlarged schematic cross-sectional view and is generally designated 10. Workpiece 10 is initially formed by forming a pad 14 to a signal processor 12. A sensing layer 18 is subsequently attached to signal processor 12 by an epoxy layer 16. In accordance with the present invention, sensing layer 18 comprises mercury cadmium telluride (HgCdTe) and signal processor 12 comprises a silicon integrated circuit.

Figure 2:
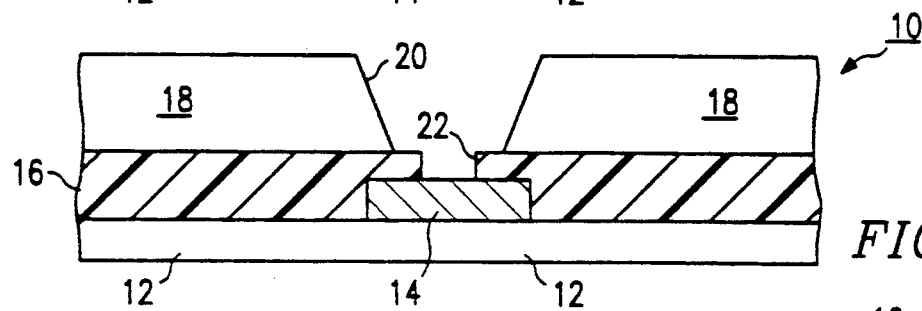
FIG. 2 is a cross-sectional view illustrating subsequent steps of FIG. 1 showing the formation of a via through the semiconductor (HgCdTe) and through the epoxy to the aluminum pad of the processor.

Referring to FIG. 2, a via 20 is formed through layer 18 and layer 16 to create an opening 22 to expose pad 14 of processor 12. Pad 14 is preferably made of aluminum.

Figure 3:
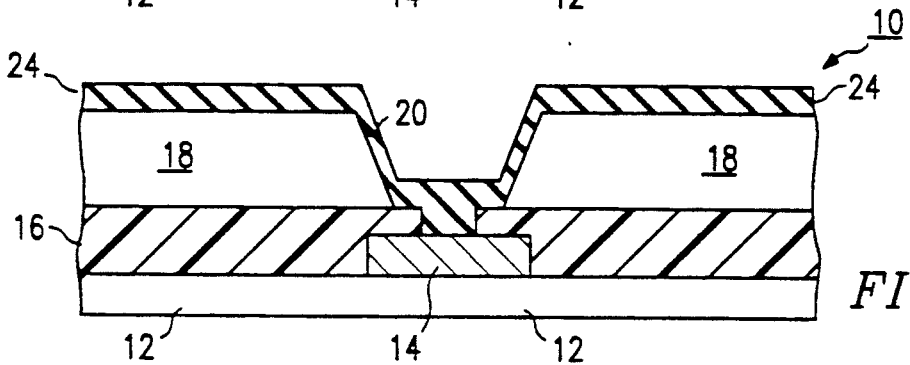
FIG. 3 is a cross-sectional view showing the deposition of the zinc sulfide (ZnS) insulator layer.

Referring to FIG. 3, an insulator layer 24 is deposited on the exposed surfaces of workpiece 10. In the preferred embodiment, insulator layer 24 is zinc sulfide (ZnS).

Figure 4:
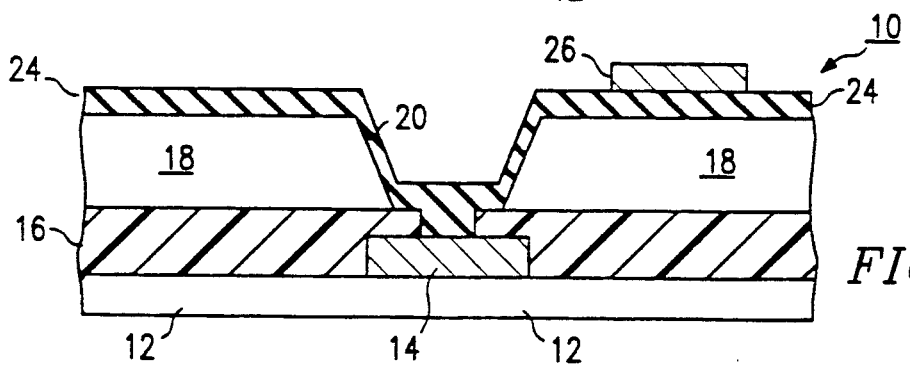
FIG. 4 is a cross-sectional view showing the formation of the refractory metal gate.

Referring to FIG. 4, in accordance with the present invention, a refractory metal layer is deposited onto insulator layer 24. Subsequently, a metal gate 26 is formed by etching the refractory metal layer. Metal gate 26 maybe a refractory metal such as tantalum, molybdenum, tungsten, titanium or a refractory metal alloy, such as titanium/tungsten.

Figure 5:
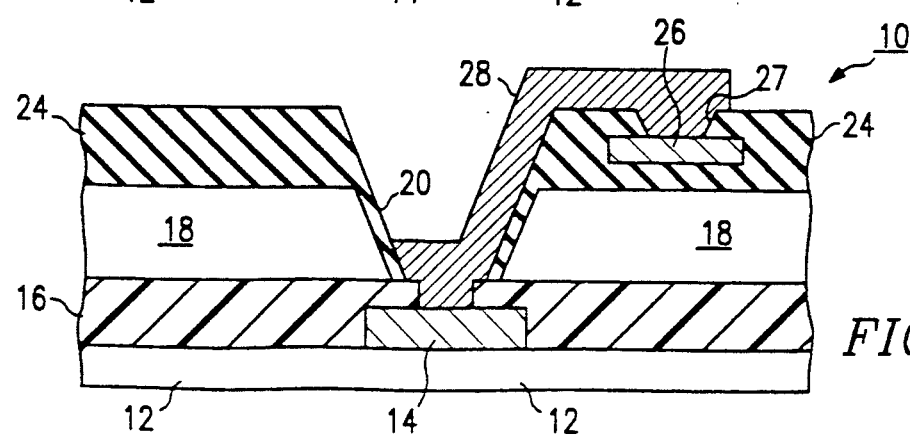
FIG. 5 is a cross-sectional view showing the deposition of the zinc sulfide (ZnS) insulating over-layer, the formation of vias or contacts through the zinc sulfide layer to the refractory metal gate and through the zinc sulfide layer to the aluminum pad of the integrated circuit processor, and the formation of the conductive metal interconnect from the refractory metal gate to the aluminum pad of the integrated processor.

Referring to FIG. 5, a second layer of the insulating material, such as zinc sulfide, is deposited to enclose gate 26. Subsequently, a via or contact 27 is formed through the second insulating layer to expose the surface of gate 26. Additionally, the etchant exposes pad 14. Finally, a conductive metal interconnect layer 28 is formed on the insulator over layer and within via 27 to electrically connect gate 26 to processor 12. Layer 28 may be indium or any other contacting metal material.

Figure 6:
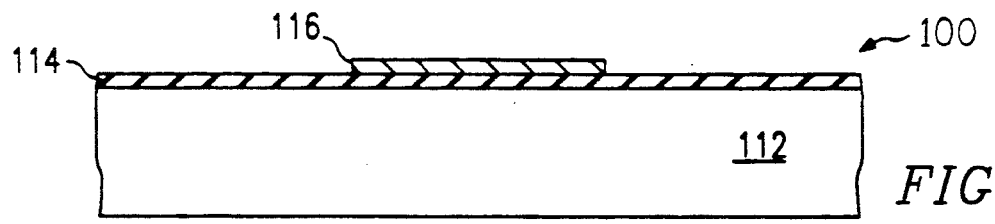
FIG. 6 is a cross-sectional view of an integrated circuit workpiece illustrating the initial deposition of a zinc sulfide layer and refractory metal gate to the sensing layer.

Referring to FIG. 6, an alternative embodiment of the present invention can be seen. An integrated workpiece is shown in its initial fabrication step in an enlarged schematic cross-sectional view and is generally designated 100. Workpiece 100 is initially formed by depositing mercury cadmium tellurium (MCT or HgCdTe) sensing layer 112. After the layer 112 has been formed, an insulator layer 114 is deposited on layer 114. Insulator 114 is zinc sulfide. Zinc sulfide layer 114 can be deposited by reacting hydrogen sulfide ($H_2S$) gas with dimethyl zinc (DMZ) gas to a desired thickness which is approximately 2000 angstroms. In subsequent fabrication, a refractory metal gate 116 is sputter-deposited onto layer 114. Gate 116 is sputtered tantalum and has a thickness of approximately 1200 angstroms. In alternative embodiments, gate 116 may comprise molybdenum, titanium, tungsten or a combination thereof.

Figure 7:
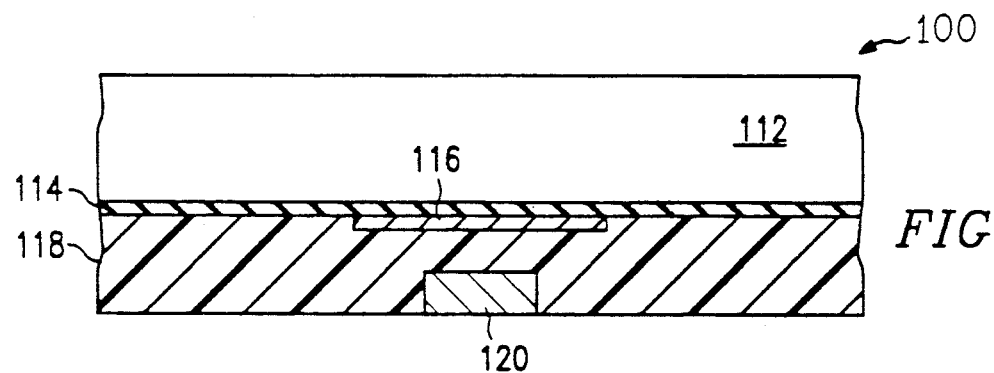
FIG. 7 is a cross-sectional view illustrating subsequent steps of FIG. 6 and more specifically illustrates the epoxy connection to the semiconductor.

Referring now to FIG. 7, the next step of fabrication is illustrated. MCT layer 112 is inverted and connected to a signal processor 120 utilizing an epoxy 118. Processor 120 is known in the art and may comprise, for example, a structure capable of relaying electronic messages from the MIS to a microprocessor. The layer 112 is then thinned to approximately 80,000 to 100,000 angstroms in thickness for further fabrication.

Figure 8:
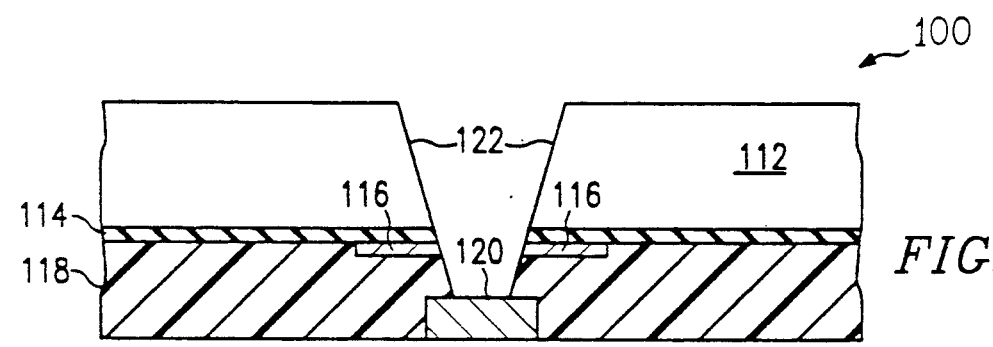
FIG. 8 is a cross-sectional view showing the formation of a via through the sensing layer, zinc sulfide layer, and refractory metal gate.

Referring to FIG. 8, a via 122 is etched through layer 112, layer 114, gate 116, and epoxy 118. Generally, layers 112 and 114 are etched with an ion etching of oxygen and fluorine. As can be seen in FIG. 8, via 122 exposes processor 120 to the atmosphere. Tests show that when using tantalum, the refractory gate 116 can be easily etched in a fluorine-oxygen plasma with good selectivity to zinc sulfide (ZnS). As has been noted, prior to using refractory metals for gate 116, aluminum was commonly used. Unfortunately, chlorine-plasma etchant was required to etch through the aluminum gate creating a corrosive atmosphere.

Figure 9:
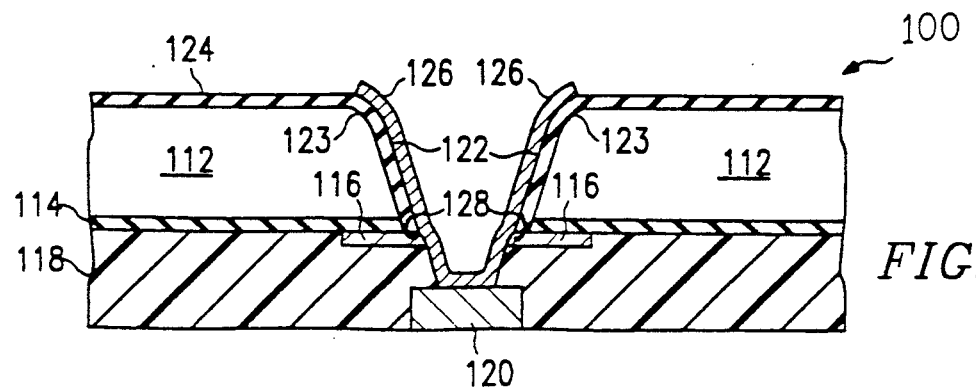
FIG. 9 is a cross-sectional view illustrating the interconnection of the conductive layer to the refractory metal gate in connection with the processor.

Referring now to FIG. 9, rounded edges 123 are formed in layer 112 by etching the via with a bromine solution. The bromine solution does not significantly reduce the thickness of the refractory metal gate 116. Consequently, corners 128 are formed which have exposed regions for contact with a metal in the subsequent process. Unlike the prior art, the refractory metal gate 116 forms an oxide layer over itself to protect the metal from the bromine solution. The reliable and relatively fast formation of an oxide film over refractory metals, such as tantalum, has been well documented in the past. Consequently, refractory metal gate 116 is more cost effective than aluminum gates in high volume production.

Corners 128 on gate 116 formed during processing can be used as a significant improvement over prior art devices by increasing the fill factor of vias 122. The fill factor is the extent of exposed metal within the interior of via 122 and the fill factor is directly proportioned to the electrical contact with the via. Consequently, the greater the fill factor, the greater the efficiency of the MIS structure. A vertically integrated MIS constructed in accordance with the prior art using an aluminum gate is limited to a minimum pixel cell size of 0.0015 inches × 0.0015 inches. This limitation is circumvented by increasing the fill factor of the vias in accordance with the present invention, which thus increases the efficiency of the entire device.

After the edges 123 of layer 112 have been rounded, the exposed surface of layer 112 is passivated and insulator 124 is deposited to approximately 2,000 angstroms. As with insulator 114, insulator 124 is generally zinc sulfide.

Via 122 can be patterned to remove any excess zinc sulfide by iron milling. Once the excess zinc sulfide is removed, the electrode is patterned. Therefore, a layer of metal 126 is formed within via 122 to electrically connect gate 116 to processor 120. In its preferred embodiment, the metal can be aluminum. In an alternative embodiment, metal 126 may be indium or tantalum.

The refractory metals (such as tantalum, tungsten, titanium, molybdenum and combinations thereof) can also be used instead of aluminum for purposes other than the MIS metal layer; such as for shade metal, guardband metal, field plate metal or transfer gate metal used in charge imaging matrix (CIM) devices. Additionally, the refractory metals can be used in the manufacture of infrared sensing structures other than the MIS structure; such as charge coupled device (CCD), charge imaging matrix (CIM), photo-diode, charge imaging detector (CID), and photo-conductors.

The refractory metal can be deposited by techniques other than sputtering, such as evaporation, although the sputtering technique provides better adhesion, better step coverage, fewer particulates and less contamination, and it can easily incorporate an in-situ sputter etch of the substrate to provide a cleaner substrate. The metal gate patterns can be formed by lift-off techniques, although dry etch methods are preferred due to less chemical usage, cleaner pattern definition, better throughput, better yield and less risk of contamination between the metal and the substrate.

In summary, the present invention sputter-deposits a refractory metal, such as tantalum, molybdenum, titanium, or tungsten, as the metal layer in the MIS structure. Even though the sputtering technique has previously been thought to result in severe physical damage to the MIS structure, recent experiments have shown that this is not the case. The advantages of using a refractory metal in the MIS structure have greatly outweighed any disadvantages and have resulted in a reduction in additional process steps to avoid subsequent etching by the bromine solution. Fortunately, an oxide film forms quickly and evenly over the refractory metal to essentially eliminate any severe bromine solution etching. Additionally, the refractory metal film can be dry etched using conventional fluorine-containing plasmas without the corrosion encountered when using chlorine-containing plasmas to dry etch aluminum films.

Operational benefits have been discovered when using such refractory metals. By forming vias in the refractory metal containing MIS, the via walls can be designed to increase the fill factor. This is accomplished by forming a vertically integrated MIS in the pixel cells which have relatively small diameters.

While preferred embodiments of the invention and their advantages have been disclosed in the above Detailed Description, the invention is not limited thereto but only by the spirit and scope of the appended claims.

What is claimed is:

1. A device for an infrared detector comprising:
   a processor device;
   a group II–VI semiconductive sensor layer;
   an insulator layer adjacent to said sensor layer having one of a single refractory metal layer and an alloy of refractory metals embedded therein;
   a via disposed through said insulator layer extending to said one of a single refractory metal layer and an alloy of refractory metals;
   a via extending through said insulator layer and said sensor layer to said processor device; and
   a metal interconnecting said one of a single refractory metal layer and an alloy of refractory metals electrically connecting said one of a single refractory metal layer and an alloy of refractory metals to said processor device.

2. The device of claim 1, wherein said refractory metal is selected from the group of tantalum, molybdenum, titanium, tungsten, and a combination thereof.

3. The device of claim 1, wherein said insulator layer is zinc sulfide.

4. The device of claim 1, wherein said interconnecting metal is selected from the group of indium, lead and a combination thereof.

5. The device of claim 1, further comprising an epoxy layer for connecting said infrared detector to said processor.

6. The device of claim 1, further comprising an aluminum pad connected to said processor.

7. The device of claim 1, wherein said sensor layer is embedded within an insulator layer.

8. An infrared detector having a metal-insulatorsemiconductor structure connected to a processor, the infrared detector comprising:
   a processor;
   a group II–VI sensing layer etchable by fluorine-oxygen plasma;
   an insulator layer etchable by fluorine-oxygen plasma having a first surface and a second surface, said first surface of said insulator layer connected to said sensing layer;
   an embedded refractory metal gate connected to a portion of said second surface of said insulator layer;
   a connecting layer disposed on said gate and said insulator layer to join said gate and said insulator layer to said processor;
   a fluorine-oxygen selectively etched via disposed through said sensing layer, said insulator layer, and said refractory metal gate extending to said processor; and
   a conductive layer connected to said refractory metal gate and said processor.

9. The device of claim 8, wherein said sensing layer is mercury cadmium tellurium.

10. The device of claim 8, wherein said insulator layer is zinc sulfide.

11. The device of claim 8, wherein said refractory metal gate is tantalum.

12. The device of claim 8, wherein said refractory metal gate is from the group of molybdenum titanium, tungsten, or titanium tungsten.

13. The device of claim 8, wherein said conductive layer is aluminum, indium, tantalum, or a combination thereof.

14. The device of claim 8, wherein said connecting layer is epoxy.

15. The device of claim 8, wherein said insulator layer has a thickness of approximately 2,000 angstroms.

16. The device of claim 8, wherein said sensing layer has a thickness between approximately 80,000 and approximately 100,000 angstroms.

17. The device of claim 8, further comprising corners formed on said refractory metal gate during formation of said via through said sensing layer for increasing the fill factor and the electrical contacting surface of said gate, said corners formed by exposing said refractory metal gate and said sensing layer to an etchant which etches said sensing layer at a faster rate than said refractory metal gate.

18. An infrared light detector having a metal-insulatorsemiconductor structure connected to a processor, the infrared light detector comprising:
   a processor;

a mercury cadmium telluride layer for sensing infrared light;

a layer of zinc sulfide insulator having a first surface and a second surface, said first surface of said layer of zinc sulfide insulator connected to said mercury cadmium tellurium layer;

an embedded refractory metal gate connected to a portion of said second surface of said layer of zinc sulfide insulator;

an epoxy layer disposed on said refractory metal gate and said insulator for connecting said layers of zinc sulfide and mercury cadmium telluride to said processor;

a via disposed in said mercury cadmium telluride layer, said insulator layer, and said refractory metal to expose said processor;

a corner disposed in said via on said refractory metal gate, said refractory metal gate having an oxide layer therein to protect said gate from exposure to a bromine solution; and a conductive layer disposed on said infrared light detector for connecting said refractory metal gate to said processor.

19. The device of claim 18, wherein said refractory metal gate is selected from the group consisting of tantalum, molybdenum, titanium, tungsten, or titanium tungsten.

20. The device of claim 18, wherein said insulator has a thickness of approximately 2,000 angstroms.

21. As in claim 18, wherein said sensing layer has a thickness between approximately 80,000 angstrom and approximately 100,000 angstrom.

* * * * *